United States Patent
Song

(10) Patent No.: US 9,508,401 B2
(45) Date of Patent: Nov. 29, 2016

(54) SEMICONDUCTOR SYSTEM AND METHOD OF OPERATING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 207 days.

(21) Appl. No.: 14/340,333

(22) Filed: Jul. 24, 2014

(65) Prior Publication Data

US 2015/0255132 A1    Sep. 10, 2015

(30) Foreign Application Priority Data

Mar. 7, 2014    (KR) .................... 10-2014-0027229

(51) Int. Cl.
```
G11C 7/00    (2006.01)
G11C 7/10    (2006.01)
G11C 7/22    (2006.01)
G11C 7/20    (2006.01)
```
(52) U.S. Cl.
CPC ............ *G11C 7/1045* (2013.01); *G11C 7/1066* (2013.01); *G11C 7/1093* (2013.01); *G11C 7/22* (2013.01); *G11C 7/20* (2013.01)

(58) Field of Classification Search
CPC .......... G11C 8/18; G11C 7/10; G11C 7/1072
USPC ............................ 365/219, 220, 230.01, 193
See application file for complete search history.

(56) References Cited

U.S. PATENT DOCUMENTS

| | | | |
|---|---|---|---|
| 8,897,083 B1 * | 11/2014 | Azizi ................... | G11C 7/1066 365/189.05 |
| 2012/0063246 A1 * | 3/2012 | Suzuki ................. | G11C 7/1066 365/193 |
| 2014/0145756 A1 * | 5/2014 | Chong ................. | H03K 19/177 326/40 |

FOREIGN PATENT DOCUMENTS

KR    1020100108792    10/2010

OTHER PUBLICATIONS

Proposed DDR4 Full spec update(79-4A), JEDEC, 2011, Solid State Technology Association, Arlington, VA.

* cited by examiner

*Primary Examiner* — Han Yang
(74) *Attorney, Agent, or Firm* — IP & T Group LLP

(57) ABSTRACT

A semiconductor system includes multiple semiconductor devices operating commonly in response to a command signal, wherein each of the multiple semiconductor devices is independently activated according to each of multiple data strobe signals respectively corresponding to the multiple semiconductor devices; and a controller suitable for providing the command signal and the multiple data strobe signals.

13 Claims, 5 Drawing Sheets

SEMICONDUCTOR SYSTEM AND METHOD OF OPERATING THE SAME

CROSS-REFERENCE TO RELATED APPLICATIONS

The present application claims priority of Korean Patent Application No. 10-2014-0027229, filed on Mar. 7, 2014, which is incorporated herein by reference in its entirety.

BACKGROUND

1. Field

Various exemplary embodiments of the present invention relate to a semiconductor design technology, and more particularly, to a semiconductor system including a plurality of semiconductor devices, and a method of operating the same.

2. Description of the Related Art

In general, a semiconductor device such as a double data rate synchronous dynamic random access memory (DDR SDRAM) includes a mode register set (MRS) for setting its operating state information, Operating states of the semiconductor device include a column address strobe (CAS) latency, a burst type, a burst length, a bank grouping mode, a delay locked loop (DLL) on/off, and the like.

Whether to set the MRS is determined in response to an external command inputted from an external controller. The external commands include a chip select command, a row address strobe (RAS) command, a column address strobe (CAS) command, a write enable command, and the like, and the MRS may be set according to such commands. During the MRS setting, data is transmitted to the MRS through a plurality of address pins. The data stored in the MRS determines the operating state of the semiconductor device.

Recently, a semiconductor device scheme has been developed to feature a semiconductor module including a plurality of semiconductor devices. The semiconductor module as well as a group of semiconductor devices may be included in a semiconductor system.

SUMMARY

Various exemplary embodiments of the present invention are directed to a semiconductor system capable of setting an operating state of each of a plurality of semiconductor devices included therein.

In accordance with an exemplary embodiment of the present invention, a semiconductor system may include: multiple semiconductor devices operating commonly in response to a command signal, wherein each of the multiple semiconductor devices is independently activated according to each of multiple data strobe signals respectively corresponding to the multiple semiconductor devices; and a controller suitable for providing the command signal, and the multiple data strobe signals.

Each of the plurality of semiconductor devices may include a shifting unit suitable for shifting a data signal in response to the corresponding data strobe signal; and a detection unit suitable for activating the corresponding semiconductor device based on a shifting result of the shifting unit.

Each of the plurality of semiconductor devices may include a counting unit suitable for activating the corresponding semiconductor device when a number of toggles of the corresponding data strobe signal reaches a preset value.

In accordance with another exemplary embodiment of the present invention, a method of operating a semiconductor system including multiple semiconductor devices may include: commonly providing a command signal to the multiple semiconductor devices; selectively activating one of the multiple semiconductor devices according to each of multiple data strobe signals respectively corresponding to the multiple semiconductor devices; and allowing the selectively activated semiconductor device to perform an operation in response to the command signal.

The method may further include resetting the multiple semiconductor devices before the selectively activating of one of the multiple semiconductor devices.

In accordance with still another exemplary embodiment of the present invention, a semiconductor system may include: multiple semiconductor devices operating commonly in response to a command signal, and suitable for commonly receiving a data signal; and a controller suitable for providing the command signal, and the data signal, wherein each of the multiple semiconductor devices is independently activated according to a number of toggles of the data signal, and wherein each of the plurality of semiconductor devices comprises a counting unit suitable for activating the corresponding semiconductor device when the number of toggles of the data signal reaches one of multiple unique counting values that respectively correspond to the multiple semiconductor devices.

The counting unit may be reset before the data signal is inputted.

The semiconductor system may further include an address signal line commonly coupled between the controller and the multiple semiconductor devices for transmission of the data signal.

In accordance with still another exemplary embodiment of the present invention, a method of operating a semiconductor system including multiple semiconductor devices may include: commonly providing a data signal and a command signal to the multiple semiconductor devices; selectively activating one of the multiple semiconductor devices when the number of toggles of the data signal reaches one of the unique counting values respectively corresponding to the multiple semiconductor devices; and allowing the selectively activated semiconductor device to perform an operation in response to the command signal.

Each of the multiple semiconductor devices includes a mode register set, and the allowing of the selectively activated semiconductor device allows the selectively activated semiconductor device to set the corresponding mode register set.

According to the semiconductor system of the embodiments, it is possible to stably set an operating state of each of a plurality of semiconductor devices.

DETAILED DESCRIPTION

Figure 1:
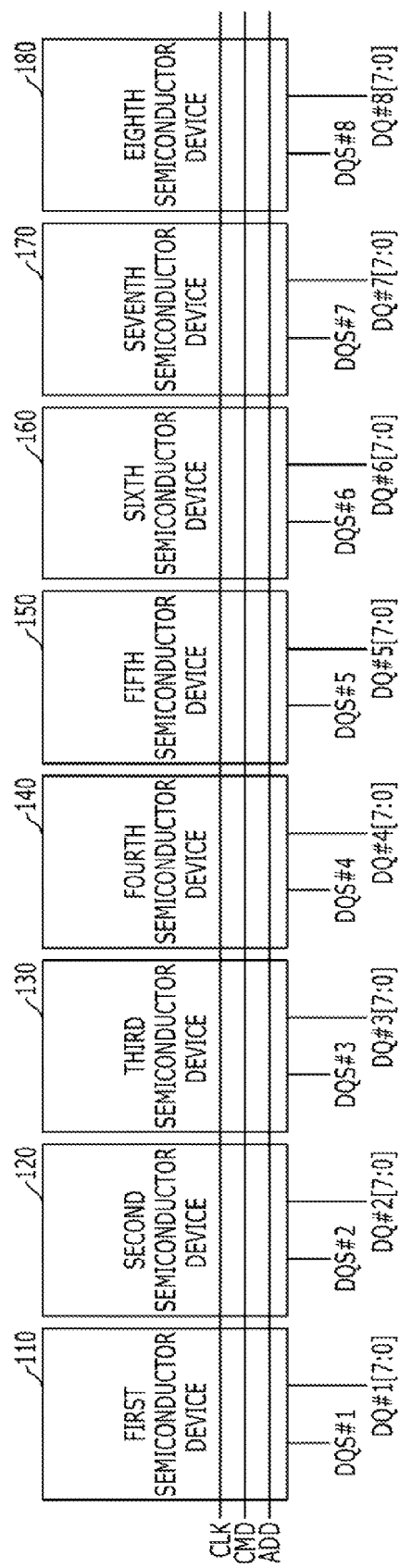
FIG. 1 is a block diagram illustrating a semiconductor system in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component, not only directly coupling another component but also indirectly coupling another component through an intermediate component. In addition, a singular form may include a plural form, and vice versa, as long as it is not specifically mentioned in a sentence.

FIG. 1 is a block diagram illustrating a semiconductor system in accordance with an exemplary embodiment of the present invention.

Referring to FIG. 1, the semiconductor system may include first to eighth semiconductor devices 110 to 180.

The first to eighth semiconductor devices 113 to 180 may share a clock signal CLK, a command signal CMD and an address signal ADD through common transmission lines while each of the first to eighth semiconductor devices 110 to 180 may receive respective data signals DQ#[7:0] and respective data strobe signals DQS# through separated transmission lines. The clock signal CLK, the command signal CMD, the address signal ADD, the data signals DQ#[7:0] and the data strobe signals DQS# may be provided from an external controller (not shown).

A mode register set (MRS, not shown) may be provided in each of the first to eighth semiconductor devices 110 to 180, and each of the first to eighth semiconductor devices 110 to 180 may set its operating state based on data stored in the MRS.

Figure 2:
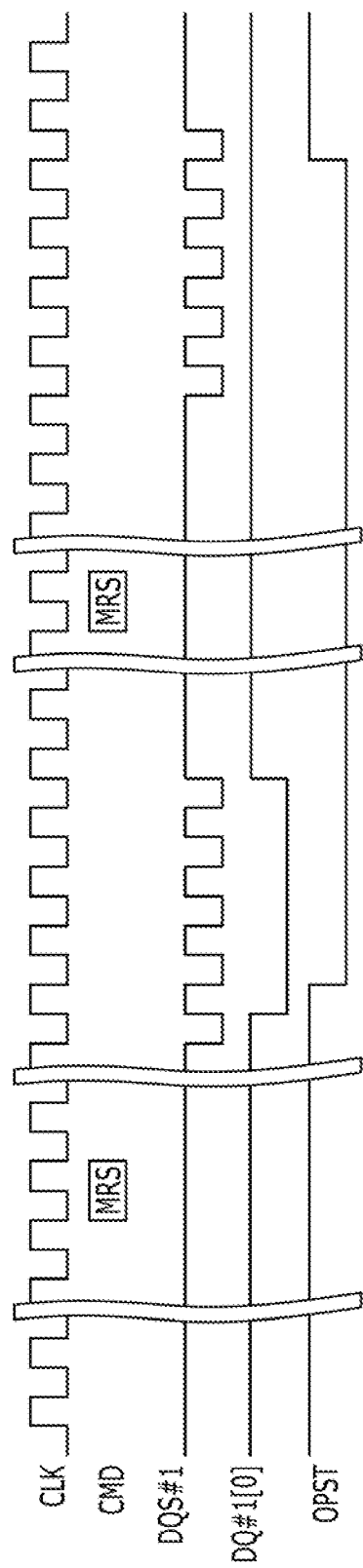
FIG. 2 is a timing diagram illustrating an operation of first to eighth semiconductor devices shown in FIG. 1.

FIG. 2 is a timing diagram illustrating an operation of the first to eighth semiconductor devices 110 to 180 shown in FIG. 1. For a clearer description, FIG. 2 illustrates operation of only one of the multiple semiconductor devices 110 to 180, namely the first semiconductor device 110, as an example. Each of the second to eighth semiconductor devices 120 to 180 may be the same as the first semiconductor device 110.

FIG. 2 shows the clock signal CLK, the command signal CMD, the data strobe signal DQS#1, the data signal DQ#1 [0], and an operating state setting signal OPST. The operating state setting signal OPST may represent a mode in which the first semiconductor device 110 may store data in the MRS therein.

Referring to FIGS. 1 and 2, the first semiconductor device 110 may receive a MRS command signal CMD for setting the MRS. As shown in FIG. 1, the MRS command signal CMD may be provided to the first to eighth semiconductor devices 110 to 180 through the common transmission lines.

Accordingly, in order to independently set the MRS of the first semiconductor device 110, a selection operation to select the first semiconductor device 110 among the first to eighth semiconductor devices 110 to 180 is required. When a selection signal for a selection operation is transmitted to the first semiconductor device 110, the first semiconductor device 110 may identify the selection through the selection signal. For example, a combination of the data signal DQ#1[0] and the data strobe signal DQS#1 may correspond to the selection signal as shown in FIG. 2.

The selection signal, or a combination of the data strobe signal DQS#1 corresponding to the first semiconductor device 110 toggling a preset number of times, and the data signal DQ#1[0] corresponding to the first semiconductor device having a logic low level may select the first semiconductor device 110. The first semiconductor device 110 may generate the operating state setting signal OPST having a logic low level in response to the selection signal. During the logic low level of the operating state setting signal OPST, for the first semiconductor device 110, may set the MRS. Similarly, each of the second to eighth semiconductor devices 120 to 180 may independently set the MRS therein when the operating state setting signal OPST corresponding to each of the second to eighth semiconductor devices 120 to 180 has a logic low level.

Figure 3:
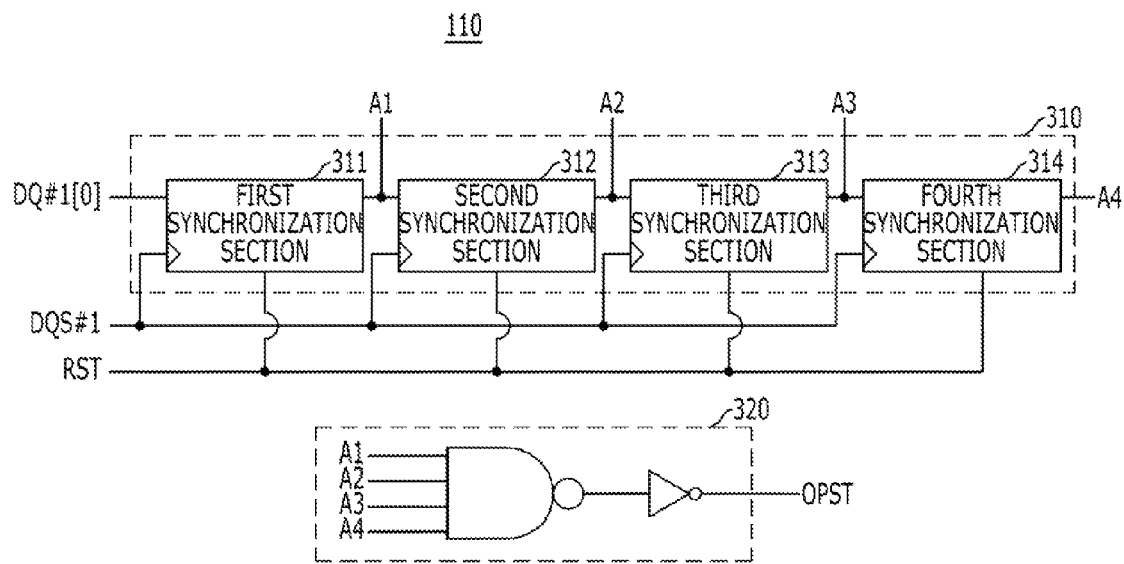
FIG. 3 is a circuit diagram illustrating the first semiconductor device shown in FIG. 1.

FIG. 3 is a circuit diagram illustrating the first semiconductor device 110 shown in FIG. 1.

Referring to FIG. 3, the first semiconductor device 110 may include a shifting unit 310 and a detection unit 320.

The shifting unit 310 may be reset in response to a reset signal RST, and shift the data signal DQ#1[0] in response to the data strobe signal DQS#1. The shifting unit 310 may include first to fourth synchronization sections 311 to 314, which output the shifting result A1 to A4, respectively. The reset signal RST may be generated in response to the MRS command signal CMD described above with reference to FIG. 2. The detection unit 320 may receive the shifting result A1 to A4 from the first to fourth synchronization sections 311 to 314 and output the operating state setting signal OPST.

When the reset signal RST is activated in response to the MRS command signal CMD, the shifting unit 310 may be reset. Then, when the data strobe signal DQS#1 toggles, the first to fourth synchronization sections 311 to 314 may sequentially shift the data signal DQ#1[0] of a logic low level, and output the shifting result A1 to A4 having a logic low level. The detection unit 320 may output the operating state setting signal OPST having a logic low level when detecting that one of the shifting result A1 to A4 has a logic low level. The operating state setting signal OPST of a logic low level may represent a mode in which the first semiconductor device 110 may store data in the MRS therein.

When the data strobe signal DQS#1 finishes toggling and the data signal DQ#1[0] maintains a logic high level, the operating state setting signal OPST has a logic high level, and the setting operation of the MRS may be finished in response to the operating state setting signal OPST having a logic high level.

Therefore, the semiconductor system in accordance with the exemplary embodiments of the present invention may selectively perform a setting operation of a MRS for each of a plurality of semiconductor devices.

FIGS. 1 to 3 shows an exemplary embodiment in which the combination of the data strobe signal DQS#1 and the data signal DQ#1[0] serves as the selection signal for selecting one of the plurality of semiconductor devices. As another embodiment, the data strobe signal DQS#1 may serve as the selection signal, which will be explained with reference to FIG. 4.

Figure 4:
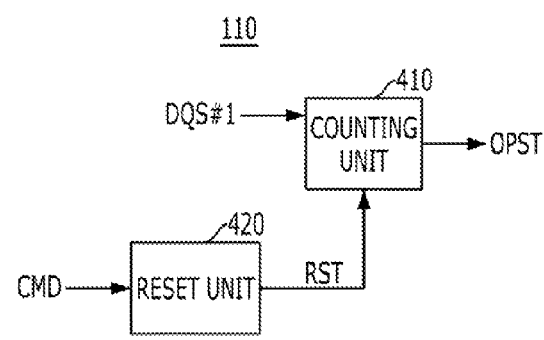
FIG. 4 is a circuit diagram illustrating the first semiconductor device shown in FIG. 1.

FIG. 4 is a circuit diagram illustrating the first semiconductor device 110 shown in FIG. 1.

Referring to FIG. 4, the first semiconductor device 110 may include a counting unit 410 and a reset unit 420.

The counting unit 410 may count a number of toggles of the data strobe signal DQS#1 to generate the operating state setting signal OPST. The operating state setting signal OPST may be activated to a logic low level when the number of toggles of the data strobe signal DQS#1 reaches a preset value. The reset unit 420 may generate the reset signal RST for resetting the counting unit 410 in response to the MRS command signal CMD.

Figure 5:
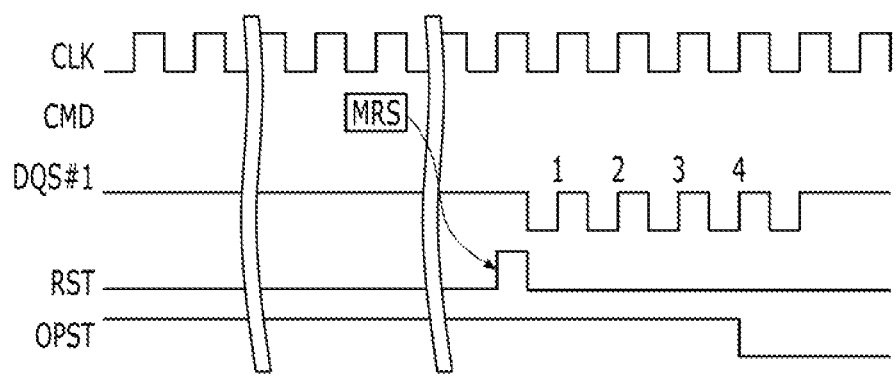
FIG. 5 is a timing diagram illustrating an operation of the first semiconductor device shown in FIG. 4.

FIG. 5 is a timing diagram illustrating an operation of the first semiconductor device 110 shown in FIG. 4. For a clearer description, FIG. 5 illustrates the operation of only one of the multiple semiconductor devices 110 to 180, namely the first semiconductor device 110, as an example. Each of the second to eighth semiconductor devices 120 to 180 may be the same as the first semiconductor device 110.

FIG. 5 shows the clock signal CLK, the command signal CMD, the data strobe signal DQS#1, the reset signal RST and the operating state setting signal OPST. As shown in FIG. 5, the reset signal RST may be activated in response to the MRS command signal CMD, and the operating state setting signal OPST may be activated to a logic low level after the number of toggles of the data strobe signal DQS#1 reaches the preset value, e.g., four. During the logic low level of the operating state setting signal OPST, for the first semiconductor device 110, the MRS may be set. Similarly, each of the second to eighth semiconductor devices 120 to 180 may independently set the MRS therein when the operating state setting signal OPST corresponding to each of the second to eighth semiconductor devices 120 to 180 has a logic low level.

Therefore, the semiconductor system in accordance with the exemplary embodiments of the present invention may selectively activate each of a plurality of semiconductor devices using the toggling data strobe signal DQS#1 which means that a setting operation of a MRS provided in each of the plurality of semiconductor devices may be selectively performed.

Figure 6:
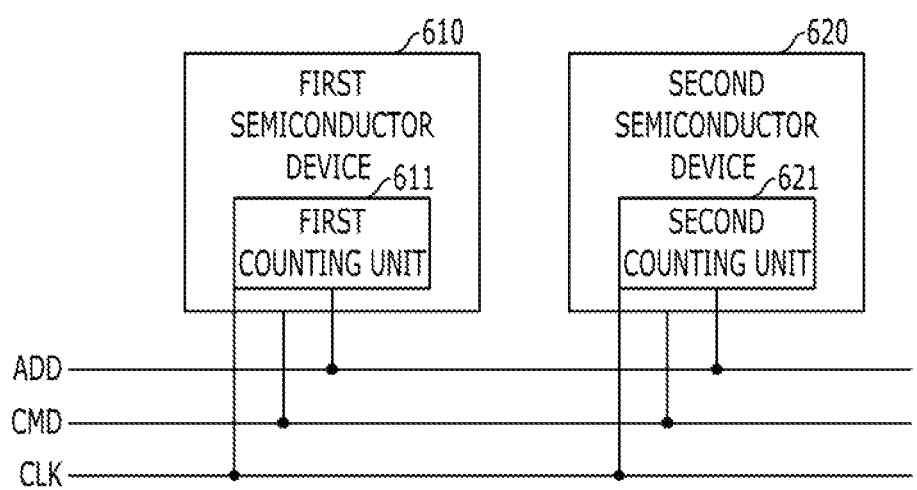
FIG. 6 is a block diagram illustrating a semiconductor system in accordance with another exemplary embodiment of the present invention.

FIG. 6 is a block diagram illustrating a semiconductor system in accordance with another exemplary embodiment of the present invention. For a clearer description, FIG. 6 illustrates operation of only two of the multiple semiconductor devices, namely the first and second semiconductor devices 610 and 620 as an example. Each of the rest semiconductor devices may be the same as the first and second semiconductor devices 610 and 620.

Referring to FIG. 6, the semiconductor system may include the first and second semiconductor devices 610 and 620, respectively comprising first and second counting units 611 and 621. Each of the first counting unit 611 of the first semiconductor device 610 and the second counting unit 621 of the second semiconductor device 620 may have a unique counting value, may count the number of toggles of a data signal transferred through an address signal line ADD, and may compare the number of toggles of the data signal with the unique counting value. The unique counting value may be a predetermined value set in each of the first and second semiconductor devices 610 and 620. A detailed description to the counting value and the unique counting value will be explained with reference to FIG. 7. The first and second counting units 611 and 621 may detect whether the number of toggles of the data signal reaches the respective unique counting values.

Figure 7:
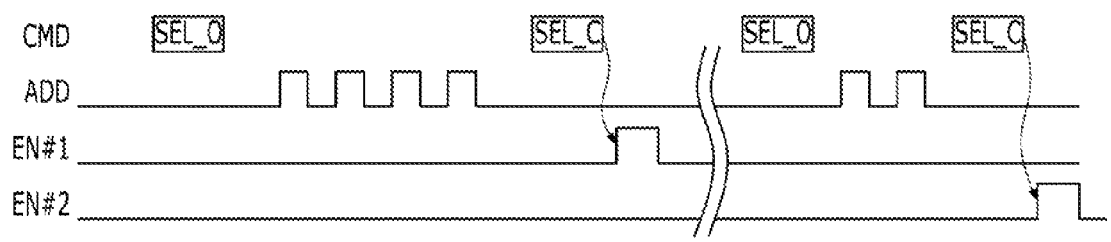
FIG. 7 is a timing diagram illustrating an operation of the semiconductor system shown in FIG. 6.

FIG. 7 is a timing diagram illustrating an operation of the semiconductor system shown in FIG. 6.

FIG. 7 shows a command signal CMD, an address signal ADD, a first operating state setting signal EN#1 for the first semiconductor device 610, and a second operating state setting signal EN#2 for the second semiconductor device 620. Although the first and second operating state setting signals EN#1 and EN#2 are not shown in FIG. 6, each of the first and second operating state setting signals EN#1 and EN#2 may correspond to a comparison result between the number of the data signal and the unique counting values.

Referring to FIGS. 6 and 7, the command signal CMD may include a count start command signal SEL_O for starting a counting operation, and a count end command signal SEL_C for finishing the counting operation.

When the data signal is inputted through the address signal line (ADD) after the count start command signal SEL_O is applied, the first and second counting units 611 and 621 count the number of toggles of the data signal. Subsequently, when the count end command signal SEL_C is applied, the data signal may finish toggling after a preset number of toggles corresponding to one of the multiple semiconductor devices. When the unique counting value of the first semiconductor device 610 is four, and the number of toggles of the data signal is also four, the first operating state setting signal EN#1 may be activated since the counting value of the first counting unit 611 is identical to the unique counting value, i.e., four. The activation of the first operating state setting signal EN#1 denotes that the first semiconductor device 610 is selected, and thus an operation in response to the command signal CMD, for example, a setting operation of a MRS provided in the first semiconductor device 610, may be performed.

Subsequently, when the unique counting value of the second semiconductor device 620 is two, and the number of toggles of the data signal between the count start command signal SEL_O and the count end command signal SEL_C is also two the second operating state setting signal EN#2 may be activated since the counting value of the second counting unit 621 is identical to the unique counting value, i.e., two. Although not shown in FIG. 7, the first and second counting units 611 and 621 may be reset in response to a reset signal prior to the counting operation, and the reset signal may be generated in response to the count start command signal SEL_O, similar to the reset signal RST of FIG. 5.

The semiconductor system in accordance with an exemplary embodiment of the present invention may selectively activate one of a plurality of semiconductor devices by a counting operation. For reference, although the above description discloses the semiconductor system transferring the data signal through the address signal line (ADD), the semiconductor system in accordance with an exemplary embodiment of the present invention may use any toggling signal transferred to the multiple semiconductor devices as the data signals.

According to the exemplary embodiments of the present invention as described above, the semiconductor system may select a target semiconductor device among a plurality of semiconductor devices to perform a predetermined operation on the target semiconductor device. Accordingly, it is possible to secure a stable setting operation of a mode register set provided in each of the plurality of semiconductor devices.

Furthermore, according to the exemplary embodiments of the present invention as described above, the semiconductor system may stably set an operating state of each of a plurality of semiconductor devices. Accordingly, it is possible to improve the reliability on the overall operations of the semiconductor system.

While the present invention has been described with respect to the specific embodiments, it will be apparent to those skilled in the art that various changes and modifications may be made without departing from the spirit and scope of the invention as defined in the following claims.

What is claimed is:

1. A semiconductor system comprising:
   multiple semiconductor devices operating commonly in response to a command signal, wherein each of the multiple semiconductor devices is independently activated according to each of multiple data strobe signals respectively corresponding to the multiple semiconductor devices; and
   a controller suitable for providing the command signal and the multiple data strobe signals,
   wherein each of the multiple semiconductor devices includes a mode register set, and
   wherein each of the multiple semiconductor devices independently sets the corresponding mode register set in response to the corresponding data strobe signal.

2. The semiconductor system of claim 1, wherein each of the multiple semiconductor devices comprises:
   a shifting unit suitable for shifting a data signal in response to the corresponding data strobe signal; and
   a detection unit suitable for activating the corresponding semiconductor device based on a shifting result of the shifting unit.

3. The semiconductor system of claim 2, wherein the shifting unit is reset before the corresponding data strobe signal is inputted.

4. The semiconductor system of claim 2, wherein the shifting unit is reset according to the command signal.

5. The semiconductor system of claim 1, wherein each of the multiple semiconductor devices comprises:
   a counting unit suitable for activating the corresponding semiconductor device when a number of toggles of the corresponding data strobe signal reaches a preset value.

6. The semiconductor system of claim 5, wherein the counting unit is reset before the corresponding data strobe signal is inputted.

7. The semiconductor system of claim 5, wherein the counting unit is reset according to the command signal.

8. A method of operating a semiconductor system including multiple semiconductor devices, the method comprising:
   commonly providing a command signal to the multiple semiconductor devices;
   selectively activating one of the multiple semiconductor devices according to each of multiple data strobe signals respectively corresponding to the multiple semiconductor devices; and
   allowing the selectively activated semiconductor device to perform an operation in response to the command signal,
   wherein each of the multiple semiconductor devices includes a mode register set, and
   wherein the allowing of the selectively activated semiconductor device allows the selectively activated semiconductor device to set the corresponding mode register set.

9. The method of claim 8, further comprising resetting the multiple semiconductor devices before the selectively activating of one of the multiple semiconductor devices.

10. The method of claim 8, wherein the selectively activating of one of the multiple semiconductor devices includes:
    transmitting a selection signal to one of the multiple semiconductor devices; and
    activating the semiconductor device receiving the selection signal.

11. A semiconductor system comprising:
    multiple semiconductor devices operating commonly in response to a command signal, and suitable for commonly receiving a data signal; and
    a controller suitable for providing the command signal and the data signal,
    wherein each of the multiple semiconductor devices is independently activated according to a number of toggles of the data signal, and
    wherein each of the multiple semiconductor devices comprises a counting unit suitable for activating the corresponding semiconductor device when the number of toggles of the data signal reaches one of unique counting values respectively corresponding to the multiple semiconductor devices,
    wherein each of the multiple semiconductor devices includes a mode register set, and
    wherein each of the multiple semiconductor devices independently sets the corresponding mode register set in response to the data signal.

12. The semiconductor system of claim 11, wherein the counting unit is reset before the data signal is inputted.

13. The semiconductor system of claim 11, further comprising an address signal line commonly coupled between the controller and the multiple semiconductor devices for transmission of the data signal.

* * * * *